(12) United States Patent
Gee et al.

(10) Patent No.: US 12,022,721 B2
(45) Date of Patent: Jun. 25, 2024

(54) ELECTROLUMINESCENT DISPLAY DEVICE

(71) Applicant: LG Display Co., Ltd., Seoul (KR)

(72) Inventors: Hyuk-Chan Gee, Paju-si (KR);
Sang-Bin Lee, Paju-si (KR);
Nack-Youn Jung, Paju-si (KR);
Jun-Ho Youn, Paju-si (KR);
Jeong-Mook Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 217 days.

(21) Appl. No.: 17/135,831

(22) Filed: Dec. 28, 2020

(65) Prior Publication Data
US 2021/0202613 A1 Jul. 1, 2021

(30) Foreign Application Priority Data
Dec. 30, 2019 (KR) .......................... 10-2019-0178261

(51) Int. Cl.
*H10K 59/35* (2023.01)
*H10K 59/122* (2023.01)
*H10K 59/88* (2023.01)

(52) U.S. Cl.
CPC ........... *H10K 59/88* (2023.02); *H10K 59/122* (2023.02); *H10K 59/352* (2023.02)

(58) Field of Classification Search
CPC ........ H01L 27/3216–3218; H10K 59/351–353
See application file for complete search history.

(56) References Cited

U.S. PATENT DOCUMENTS

| | | | |
|---|---|---|---|
| 2013/0059405 A1* | 3/2013 | Goda | H10K 59/122 438/34 |
| 2015/0311268 A1* | 10/2015 | Cheng | H10K 59/352 257/40 |
| 2017/0005151 A1* | 1/2017 | Kim | H01L 27/3246 |
| 2017/0110519 A1* | 4/2017 | Hsu | H10K 50/852 |
| 2018/0374909 A1* | 12/2018 | Nishikiori | H01L 27/3246 |
| 2019/0229163 A1* | 7/2019 | Murai | H01L 27/326 |
| 2019/0312235 A1* | 10/2019 | Fukuoka | G09G 3/3233 |
| 2020/0212134 A1* | 7/2020 | Lee | H01L 27/3211 |
| 2020/0257162 A1* | 8/2020 | Lee | H10K 59/122 |
| 2021/0043706 A1* | 2/2021 | Kobayashi | H10K 50/15 |

* cited by examiner

*Primary Examiner* — Eric K Ashbahian
(74) *Attorney, Agent, or Firm* — Fenwick & West LLP

(57) ABSTRACT

An electroluminescent display device includes a substrate on which a display area and a non-display area are defined; first, second and third sub-pixel rows in the display area each including a plurality of sub-pixels arranged along a first direction and disposed along a second direction; a light-emitting diode disposed at each of the plurality of sub-pixels and including a first electrode, a light-emitting layer and a second electrode; a dummy sub-pixel in the non-display area and corresponding to the second sub-pixel row; and a partition wall across the third sub-pixel row along the first direction and disposed on the first electrodes of the third sub-pixel row, wherein a width of the second sub-pixel row along the second direction is larger than a width of the first sub-pixel row and smaller than a width of the third sub-pixel row.

24 Claims, 15 Drawing Sheets

ELECTROLUMINESCENT DISPLAY DEVICE

CROSS-REFERENCE TO RELATED APPLICATION

The present application claims priority from and the benefit under 35 U.S.C § 119(a) of Republic of Korea Patent Application No. 10-2019-0178261 filed on Dec. 30, 2019, which is hereby incorporated by reference in its entirety.

BACKGROUND

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response speed. Further, the electroluminescent display device is more resistant against the external impacts and is used in a wide range of temperatures because its components are solids, and particularly, the electroluminescent display device can be manufactured at low costs.

The electroluminescent display device includes a plurality of pixels, each of which has first, second, and third sub-pixels, and displays various color images by allowing the first, second, and third sub-pixels to selectively emit light.

The first, second, and third sub-pixels have red, green, and blue light-emitting layers, respectively, and each light-emitting layer is formed through a vacuum thermal evaporation process in which a luminescent material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate on which a display area displaying an image and a non-display area disposed adjacent to the display area are defined; first, second and third sub-pixel rows in the display area on the substrate, the first, second and third sub-pixel rows each including a plurality of sub-pixels arranged along a first direction and disposed along a second direction perpendicular to the first direction; a light-emitting diode disposed at each of the plurality of sub-pixels and including a first electrode, a light-emitting layer and a second electrode; a dummy sub-pixel in the non-display area on the substrate, the dummy sub-pixel corresponding to the second sub-pixel row; and a partition wall across the third sub-pixel row along the first direction and disposed on the first electrodes of the third sub-pixel row, wherein a width of the second sub-pixel row along the second direction is larger than a width of the first sub-pixel row and smaller than a width of the third sub-pixel row.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure. In the drawings.

DETAILED DESCRIPTION

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes first, second, and third sub-pixels. A pixel region corresponding to each sub-pixel can have a configuration shown in FIG. 1.

Figure 1:
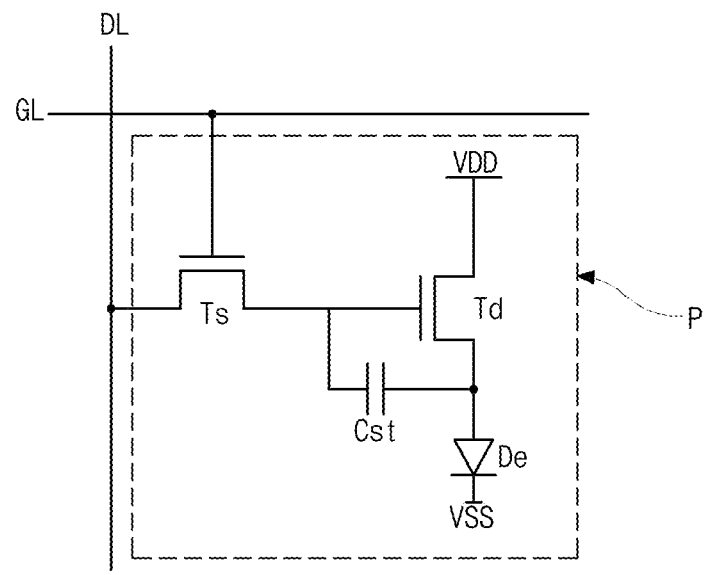
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed over time, and thus the pixel region P of the electroluminescent display device displays a different gray level with respect to the same data signal over time. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
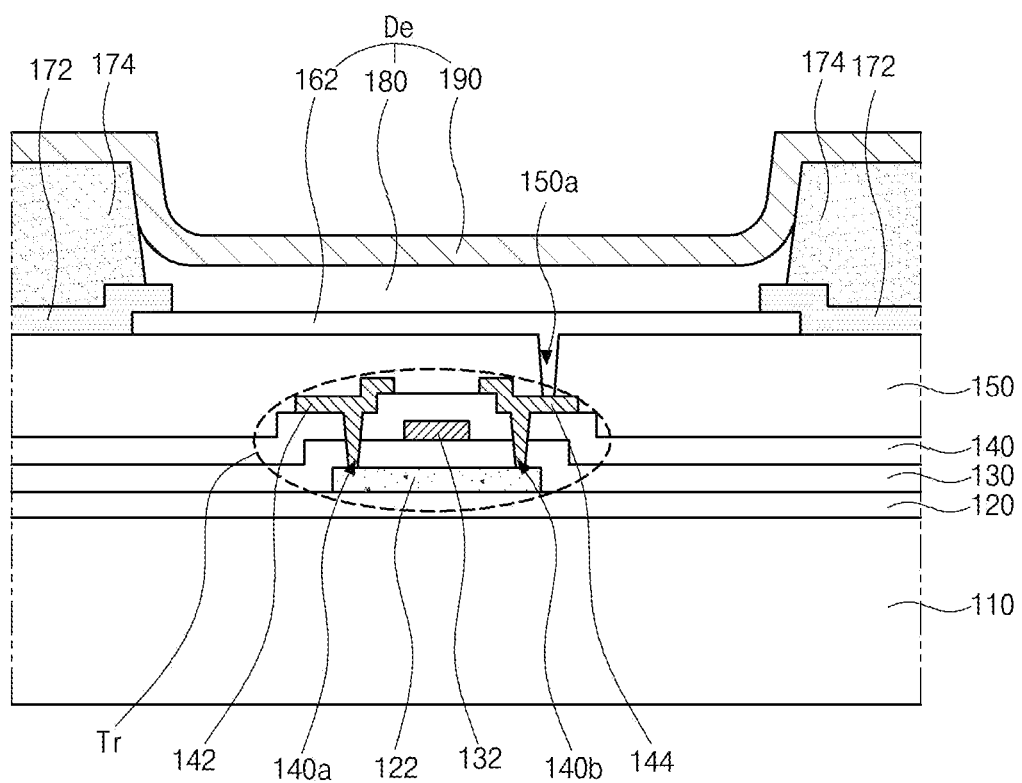
FIG. 2 is a schematic cross-sectional of an electroluminescent display device according to the embodiment of the present disclosure.

FIG. 2 is a schematic cross-sectional of an electroluminescent display device according to the embodiment of the present disclosure and shows one pixel region.

In the electroluminescent display device of FIG. 2, a buffer layer 120 is formed on a substrate 110. The buffer layer 120 is disposed substantially on an entire surface of the substrate 110. The substrate 110 can be a glass substrate or a plastic substrate. For example, polyimide can be used as the plastic substrate, but is not limited thereto. The buffer layer 120 can be formed of an inorganic material, such as silicon oxide ($SiO_2$) or silicon nitride (SiNx), and can be a single layer or multiple layers.

A patterned semiconductor layer 122 is formed on the buffer layer 120. The semiconductor layer 122 can be formed of an oxide semiconductor layer, and a light-shielding pattern can be further formed under the semiconductor layer 122. The light-shielding pattern can block light incident on the semiconductor layer 122 and can reduce deterioration of the semiconductor layer 122 due to the light. Alternatively, the semiconductor layer 122 can be formed of polycrystalline silicon, and both ends of the semiconductor layer 122 can be doped with impurities.

A gate insulation layer 130 of an insulating material is formed on the semiconductor layer 122 substantially over the entire surface of the substrate 110. The gate insulation layer 130 can be formed of an inorganic insulating material such as silicon oxide ($SiO_2$) or silicon nitride (SiNx). When the semiconductor layer 122 is made of an oxide semiconductor material, the gate insulation layer 130 can be formed of silicon oxide ($SiO_2$). Alternatively, when the semiconductor layer 122 is made of polycrystalline silicon, the gate insulation layer 130 can be formed of silicon oxide ($SiO_2$) or silicon nitride (SiNx).

A gate electrode 132 of a conductive material such as metal is formed on the gate insulation layer 130 corresponding to the center of the semiconductor layer 122. In addition, a gate line and a first capacitor electrode can be formed on the gate insulation layer 130. The gate line extends in a first direction, and the first capacitor electrode is connected to the gate electrode 132.

In the embodiment of the present disclosure, the gate insulation layer 130 is formed substantially over the entire surface of the substrate 110. However, the gate insulation layer 130 can be patterned to have the same shape as the gate electrode 132.

An interlayer insulation layer 140 made of an insulating material is formed on the gate electrode 132 substantially over the entire surface of the substrate 110. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first and second contact holes 140a and 140b exposing top surfaces of both ends of the semiconductor layer 122. The first and second contact holes 140a and 140b are disposed at both sides of the gate electrode 132 and spaced apart from the gate electrode 132. The first and second contact holes 140a and 140b are also formed in the gate insulation layer 130. Alternatively, when the gate insulation layer 130 is patterned to have the same shape as the gate electrode 132, the first and second contact holes 140a and 140b are formed only in the interlayer insulation layer 140.

Source and drain electrodes 142 and 144 of a conductive material such as metal are formed on the interlayer insulation layer 140. In addition, a data line, a power supply line and a second capacitor electrode can be further formed on the interlayer insulation layer 140.

The source and drain electrodes 142 and 144 are spaced apart from each other with the gate electrode 132 positioned therebetween and are in contact with both ends of the semiconductor layer 122 through the first and second contact holes 140a and 140b, respectively. The data line extends in a second direction and crosses the gate line to thereby define a pixel region. The power supply line for supplying a high voltage is spaced apart from the data line. The second capacitor electrode is connected to the drain electrode 144. The second capacitor electrode overlaps the first capacitor electrode to thereby constitute a storage capacitor with the interlayer insulation layer 140 therebetween as a dielectric. Alternatively, the first capacitor electrode can be connected to the drain electrode 144, and the second capacitor electrode can be connected to the gate electrode 132.

The semiconductor layer 122, the gate electrode 132, the source electrode 142, and the drain electrode 144 form a thin film transistor Tr. The thin film transistor Tr has a coplanar structure in which the gate electrode 132, the source electrode 142, and the drain electrode 144 are located at the same side with respect to the semiconductor layer 122.

Alternatively, the thin film transistor Tr can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. The semiconductor layer can be formed of oxide semiconductor or amorphous silicon.

The thin film transistor Tr corresponds to a driving thin film transistor Td of FIG. 1, and a switching thin film transistor Ts of FIG. 1 having the same structure as the thin film transistor Tr can be further formed in the pixel region on the substrate 110. The gate electrode 132 of the thin film transistor Tr can be connected to a drain electrode of the switching thin film transistor, and the source electrode 142 of the thin film transistor Tr is connected to the power supply line. In addition, a gate electrode and a source electrode of the switching thin film transistor can be connected to the gate line and the data line, respectively.

A sensing thin film transistor having the same structure of the thin film transistor Tr can be further formed in the pixel region on the substrate 110, but the present disclosure is not limited thereto.

An overcoat layer 150 of an insulating material is formed on the source and drain electrodes 142 and 144 substantially over the entire surface of the substrate 110. The overcoat layer 150 can be formed of an organic insulating material such as photo acryl or benzocyclobutene. The overcoat layer 150 can have a flat top surface.

Meanwhile, an insulation layer of an inorganic insulating material such as silicon oxide ($SiO_2$) or silicon nitride (SiNx) can be further formed under the overcoat layer 150, that is, between the thin film transistor Tr and the overcoat layer 150.

The overcoat layer 150 has a drain contact hole 150a exposing the drain electrode 144. The drain contact hole 150a can be spaced apart from the second contact hole 140b. Alternatively, the drain contact hole 150a can be disposed right over the second contact hole 140b such that the drain contact hole 150a and the second contact hole overlap.

A first electrode 162 is formed on the overcoat layer 150 and formed of a conductive material having a relatively high work function. The first electrode 162 is disposed in the pixel region and is in contact with the drain electrode 144 through the drain contact hole 150a. For example, the first electrode 162 can be formed of a transparent conductive material such as indium tin oxide (ITO) or indium zinc oxide (IZO), but is not limited thereto.

The electroluminescent display device according to the embodiment of the present disclosure can be a top emission type in which light of a light-emitting diode De is output toward a direction opposite the substrate 110. Accordingly, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy, silver (Ag) or aluminum (Al). The first electrode 162 can have a triple-layer structure of ITO/APC/ITO, ITO/Ag/ITO or ITO/Al/ITO, but is not limited thereto.

A bank of an insulating material is formed on the first electrode 162. The bank can include a first bank 172 of a hydrophilic property and a second bank 174 of a hydrophobic property.

More particularly, the first bank 172 overlaps and covers edges of the first electrode 162 and exposes a central portion of the first electrode 162. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 is formed on the first bank 172. At this time, at least an upper surface of the second bank 174 is hydrophobic, and a side surface of the second bank 174 can be hydrophobic or hydrophilic.

The second bank 174 has a narrower width than the first bank 172, is disposed on the first bank 172, and exposes edges of the first bank 172. A thickness of the second bank 174 can be greater than a thickness of the first bank 172. The second bank 174 can overlap the edges of the first electrode 162. Alternatively, the second bank 174 can be spaced apart from the first electrode 162 without an overlap.

The second bank 174 can be formed of an organic insulating material having a hydrophobic property. Alternatively, the second bank 174 can be formed of an organic insulating material having a hydrophilic property and can be subjected to a hydrophobic treatment.

Meanwhile, only the first bank 172 can be disposed on other edges of the first electrode 162 not shown in the figure. In addition, even if the first and second banks 172 and 174 are formed on the edges of the first electrode 162 in FIG. 2, in another embodiment, the first bank 172 can be omitted, and only the second bank 174 can overlap and cover the edges of the first electrode 162.

In FIG. 2, the first bank 172 and the second bank 174 are separately formed of different materials. However, the hydrophilic first bank 172 and the hydrophobic second bank 174 can be formed of the same material and formed as one body. For example, after an organic material layer having a hydrophobic upper surface can be formed substantially over the entire surface of the substrate 110, the organic material layer can be exposed to light using a halftone mask, which includes a light-transmitting portion, a light-blocking portion and a half light-transmitting portion, and can be patterned, thereby forming the first bank 172 and the second bank 174 having different widths and thicknesses.

In addition, the drain contact hole 150a is spaced apart from the first and second banks 172 and 174, but is not limited thereto. Alternatively, the drain contact hole 150a can be disposed right under the first and second banks 172 and 174.

Next, a light-emitting layer 180 is formed on the first electrode 162 exposed by the first bank 172 and the second bank 174.

The light-emitting layer 180 can include a light-emitting material layer. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

Further, the light-emitting layer 180 can further include a first charge auxiliary layer under the light-emitting material layer and a second charge auxiliary layer over the light-emitting material layer.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

The light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto.

When the solution is dried, a drying speed of a solvent in a region adjacent to the second bank 174 is different from that in other regions. That is, the drying speed of the solvent in the region adjacent to the second bank 174 is faster than that in the other regions. Therefore, a height of the light-emitting layer 180 in the region adjacent to the second bank 174 can rise as it gets closer to the second bank 174.

Meanwhile, among the layers of the light-emitting layer 180, the electron auxiliary layer can be formed through a thermal evaporation process. At this time, the electron auxiliary layer can be formed substantially over the entire surface of the substrate 110.

A second electrode 190 of a conductive material having a relatively low work function is formed on the light-emitting layer 180 substantially over the entire surface of the substrate 110. The second electrode 190 can be formed of aluminum (Al), magnesium (Mg), silver (Ag), or an alloy thereof. The second electrode 190 has a relatively thin thickness such that light from the light-emitting layer 180 can be transmitted therethrough. Alternatively, the second electrode 190 can be formed of a transparent conductive material such as indium-gallium-oxide (IGO), but is not limited thereto.

The first electrode 162, the light-emitting layer 180 and the second electrode 190 constitute a light-emitting diode De. The first electrode 162 can serve as an anode, and the second electrode 190 can serve as a cathode, but is not limited thereto.

As described above, the electroluminescent display device according to the embodiment of the present disclosure can be a top emission type display device in which light from the light-emitting layer 180 of the light-emitting diode De is output toward a direction opposite the substrate 110, that is, output to the outside through the second electrode 190. The top emission type display device can have a wider emission area than a bottom emission type display device of the same size, to thereby improve luminance and reduce power consumption.

The light-emitting diode De of each pixel region can have an element thickness for a micro-cavity effect corresponding to a wavelength of the emitted light, thereby increasing the light efficiency. Here, the element thickness can be defined as a distance between the first electrode 162 and the second electrode 190, but is not limited thereto.

In addition, a protective layer and/or an encapsulating layer can be formed on the second electrode 190 substantially over the entire surface of the substrate 110 to block moisture or oxygen introduced from the outside, thereby protecting the light-emitting diode De.

As described above, in the electroluminescent display device according to the embodiment of the present disclosure, by forming some of the light-emitting layer 180 through the solution process, a fine metal mask is omitted to thereby reduce the manufacturing costs, and a display device with a large size and high definition can be implemented.

By the way, when the light-emitting layer 180 is formed through the solution process, the solution is dropped in each of a plurality of sub-pixels at a time, and to do this, different nozzles are used for respective sub-pixels. However, a variation in the thickness of a thin film formed in each sub-pixel occurs due to a deviation in the dropping amounts of the nozzles. Accordingly, in the present disclosure, the light-emitting layers 180 of the same color sub-pixels are connected to each other to thereby form one body. Thus, the deviation in the dropping amounts of the nozzles is minimized, and thicknesses of the light-emitting layers 180 formed in the respective sub-pixels can be uniform.

The configuration of the electroluminescent display device according to various embodiments of the present disclosure will be described with reference to accompanying drawings.

Figure 3:
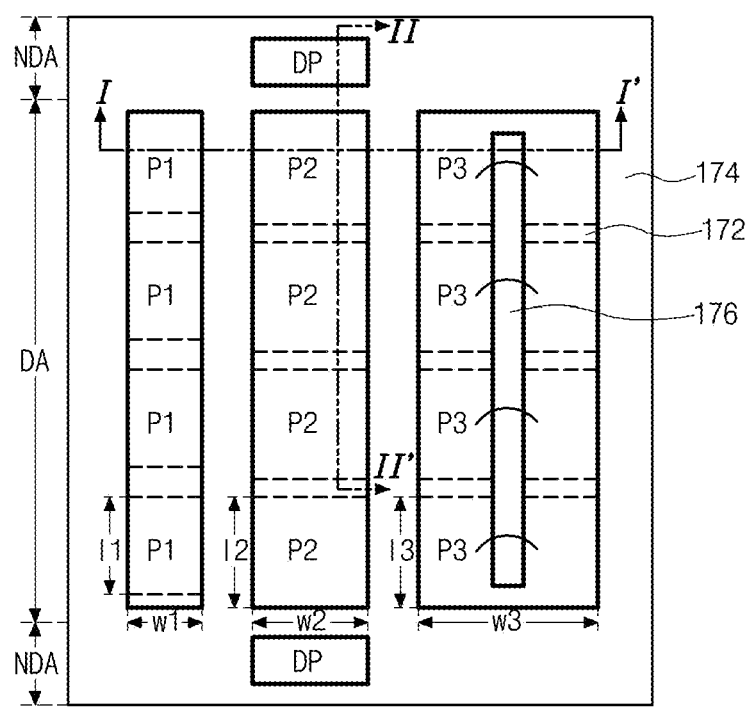
FIG. 3 is a schematic plan view of an electroluminescent display device according to a first embodiment of the present disclosure.

FIG. 3 is a schematic plan view of an electroluminescent display device according to a first embodiment of the present disclosure and mainly shows a bank configuration.

In FIG. 3, the electroluminescent display device 100 according to the first embodiment of the present disclosure includes a display area DA displaying an image and a non-display area NDA disposed outside the display area DA. Here, the non-display area NDA is illustrated to be disposed above and below the display area DA, but is not limited thereto. Alternatively, the non-display area NDA can be further disposed to the left and right of the display area DA.

In the display area DA, first, second, and third sub-pixels P1, P2 and P3 are disposed. The same color sub-pixels P1, P2 and P3 are arranged along a first direction (e.g., vertical direction), and the different color sub-pixels P1, P2 and P3 are sequentially arranged along a second direction (e.g., horizontal direction) perpendicular to the first direction. Accordingly, the same color sub-pixels P1, P2 and P3 arranged along the first direction form one sub-pixel row, and different color sub-pixel rows, that is, first, second and third sub-pixel rows are sequentially arranged along the second direction in the display area DA.

Here, the first, second and third sub-pixels P1, P2 and P3 are shown to each have a rectangular shape, but is not limited thereto. The first, second and third sub-pixels P1, P2 and P3 each can have various shapes such as a rectangular shape with rounded corners, a circular shape, an oval shape, or the like.

The first, second and third sub-pixels P1, P2 and P3 of the present disclosure have different sizes. The sizes of the first, second and third sub-pixels P1, P2 and P3 are determined by considering the lifetimes of the light-emitting diodes provided at respective sub-pixels. In one embodiment, the size of the second sub-pixel P2 may be larger than the size of the first sub-pixel P1 and smaller than the size of the third sub-pixel P3. For example, the first sub-pixel P1 can be a red sub-pixel, the second sub-pixel P2 can be a green sub-pixel, and the third sub-pixel P3 can be a blue sub-pixel. Since the light-emitting properties of the blue sub-pixel, that is, the luminescent efficiency and the lifetime of the blue sub-pixel are poor compared to the red and green sub-pixels, the third sub-pixel, which is the blue sub-pixel, can have the largest size.

Here, the first, second and third sub-pixels P1, P2 and P3 can have different widths along the second direction. For example, the first, second and third sub-pixels P1, P2 and P3 can have first, second and third widths w1, w2 and w3 along the second direction, respectively, and the second width w2 of the second sub-pixel P2 can be larger than the first width w1 of the first sub-pixel P1 and smaller than the third width w3 of the third sub-pixel P3. Accordingly, a width of the second sub-pixel row, which is the same as the second width w2, can be larger than a width of the first sub-pixel row, which is the same as the first width w1, and smaller than a width of the third sub-pixel row, which is the same as the third width w3.

In addition, the first, second and third sub-pixels P1, P2 and P3 can have first, second and third lengths l1, l2 and l3 along the first direction. The second and third lengths l2 and l3 of the second and third sub-pixels P2 and P3 can be the same, and the first length l1 of the first sub-pixel P1 can be smaller than the second and third lengths l2 and l3 of the second and third sub-pixels P2 and P3. Alternatively, the lengths l1, l2 and l3 of the first, second and third sub-pixels P1, P2 and P3 can be the same.

However, the present disclosure is not limited thereto, and the widths and lengths of the first, second and third sub-pixels P1, P2 and P3 can be changed.

Meanwhile, dummy sub-pixels DP are disposed in the non-display area NDA corresponding to the second sub-pixel row along the first direction. On the other hand, no dummy sub-pixel is disposed in the non-display area NDA corresponding to the first and third sub-pixel rows.

At this time, one dummy sub-pixel DP is disposed at each of both sides of the second sub-pixel row along the first direction. The size of the dummy sub-pixel DP can be smaller than the size of the second sub-pixel P2. Alternatively, the dummy sub-pixel DP can have the same size as the second sub-pixel P2.

The first, second and third sub-pixels P1, P2 and P3 and the dummy sub-pixel DP can be defined by first and second banks 172 and 174.

More particularly, the first bank 172 of a hydrophilic property is disposed between adjacent same color sub-pixels P1, P2 and P3 along the first direction. That is, the first bank 172 extends in the second direction between the adjacent color sub-pixels P1, P2 and P3 along the first direction.

In addition, the first bank 172 is also formed in the non-display area NDA. The first bank 172 can be formed to enclose all the sub-pixels P1, P2 and P3 of the display area DA. Alternatively, the first bank 172 can be omitted in the non-display area NDA.

The second bank 174 of a hydrophobic property is disposed between adjacent different color sub-pixels P1, P2 and P3 along the second direction. That is, the second bank 174 extends in the first direction between the adjacent sub-pixels P1, P2 and P3 along the second direction. The second bank 174 has an opening corresponding to each row of the same color sub-pixels P1, P2 and P3 arranged along the first direction. Accordingly, the opening of the second bank 174 extends in the first direction, and the opening of the second bank 174 has a length of the first direction greater than a length of the second direction, i.e., a width. In other words, the opening of the second bank 174 has a long side parallel to the first direction and a short side parallel to the second direction.

In the display area DA, the first bank 172 can be further formed under the second bank 174. That is, the first bank 172 can also be formed between the adjacent different color sub-pixels P1, P2 and P3 along the second direction. At this time, the width of the second bank 174 along the second direction can be smaller than the width of the first bank 172 along the second direction. Alternatively, the first bank 172 can be omitted between the adjacent different color sub-pixels P1, P2 and P3 along the second direction.

The second bank 174 is also disposed in the non-display area NDA. The second bank 174 has an opening corresponding to the dummy sub-pixel DP.

Meanwhile, a partition wall 176 is formed in the third sub-pixel. The partition wall 176 can be referred to as a pixel dividing pattern. The partition wall 176 extends in the first direction and crosses the third sub-pixel row.

Each third sub-pixel P3 is divided into two regions adjacent to each other along the second direction by the partition wall 176. At this time, the two regions of the third sub-pixel P, beneficially, have the same width. In addition, the width of each of the two regions is smaller than the second width w2. The width of each of the two regions can be the same as the first width w1.

Since the partition wall 176 is disposed in an emission area, a decrease in a size of the emission area can be reduced by reducing the width of the partition wall 176. Accordingly, the width of the partition wall 176 can be narrower than the width of the second bank 174. Alternatively, the width of the partition wall 176 can be the same as the width of the second bank 174.

Figure 12:
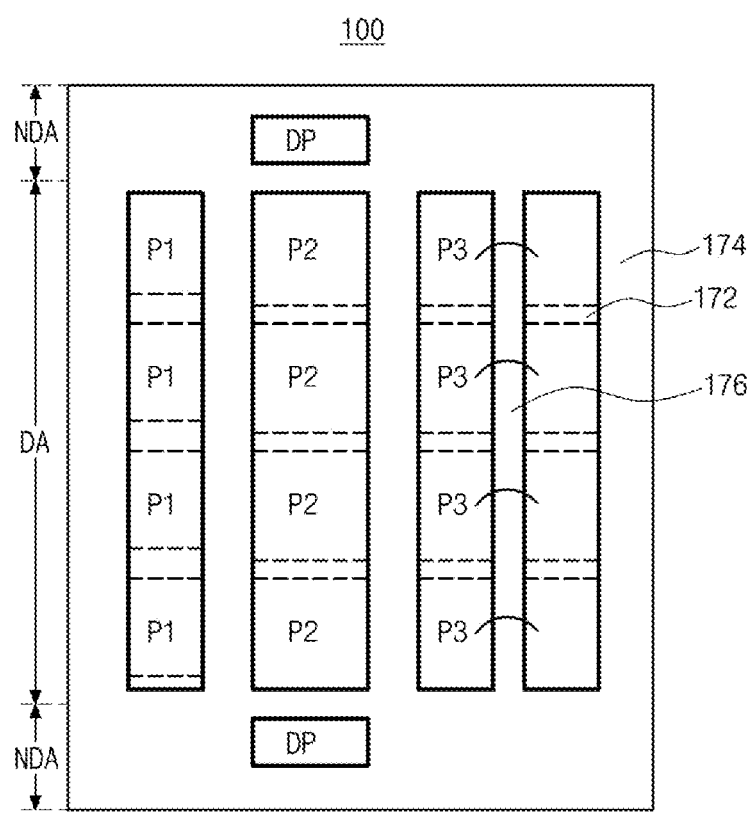
FIG. 12 is a schematic plan view of another example of an electroluminescent display device according to the first embodiment of the present disclosure

In addition, both ends of the partition wall 176 along the first direction can be spaced apart from the second bank 174. Alternatively, as shown in FIG. 12, the both ends of the partition wall 176 along the first direction can be in contact with the second bank 174. In this case, the partition wall 176 can be formed as one body with the second bank 174.

The partition wall 176 can be formed through the same process as and formed of the same material as the second bank 174. Accordingly, at least a top surface of the partition wall 176 can be hydrophobic.

In the electroluminescent display device 100 according to the first embodiment of the present disclosure, a light-emitting diode including a light-emitting layer is formed in each sub-pixel P1, P2 and P3, and the light-emitting layer is formed through a solution process. That is, the light-emitting layer can be formed through the solution process without a fine metal mask to thereby reduce the manufacturing costs of the electroluminescent display device 100, and the electroluminescent display device 100 with a large size and high definition can be implemented.

In addition, the light-emitting layers of the same color sub-pixels P1, P2 and P3 are connected to each other and formed as one body, thereby reducing the deviation in the dropping amount between nozzles and uniformly forming the thicknesses of the light-emitting layers of the sub-pixels P1, P2 and P3.

However, the solution can be concentrated from the ends of each same color sub-pixel row into the center of same color sub-pixel row along the first direction. Accordingly, there can be the problem that the light-emitting layer is not formed or is formed with a non-uniform thickness in the sub-pixels P1, P2 and P3 at the ends of the same color sub-pixel row.

Meanwhile, when the width of the sub-pixel row is relatively narrow, the solution concentrating problem does not occur or is reduced. On the other hand, when the width of the sub-pixel row is relatively wide, the solution concentrating problem severely occurs.

That is, the solution concentrating problem occurs in the second sub-pixel P2 of the green sub-pixel and the third sub-pixel P3 of the blue sub-pixel, which have the wider widths than the first sub-pixel P1 of the red sub-pixel, and the solution concentrating problem occurs most in the third sub-pixel P3 having the widest width.

Accordingly, in the electroluminescent display device 100 according to the first embodiment of the present disclosure, the partition wall 176 extending in the first direction is formed in the third sub-pixel P3 having the widest width w3 along the second direction, and the third sub-pixel P3 is divided into two regions having the reduced width. Therefore, each divided region of the third sub-pixel P3 has the relatively narrow width, and the solution concentrating problem can be prevented or minimized in the third sub-pixel row.

In addition, the dummy sub-pixels DP including a dummy light-emitting layer are provided at the upper and lower sides of the second sub-pixel row. Accordingly, the saturation of the solution increases at ends of the second sub-pixel row, and the solution concentrating problem can be prevented or reduced in the second sub-pixel row.

In the first embodiment of the present disclosure, the dummy sub-pixel DP is described as being spaced apart from the second sub-pixel row, but is not limited thereto. Alternatively, the dummy sub-pixel DP can be connected to the second sub-pixel row. That is, the opening corresponding to the second sub-pixel row can extend into the dummy pixel DP. Accordingly, the light-emitting layers of the second sub-pixel row can be connected to the dummy light-emitting layer of the dummy sub pixel DP to thereby form one body.

A cross-sectional structure of the electroluminescent display device according to the first embodiment of the present disclosure will be described with reference to FIG. 4 and FIG. 5.

Figure 4:
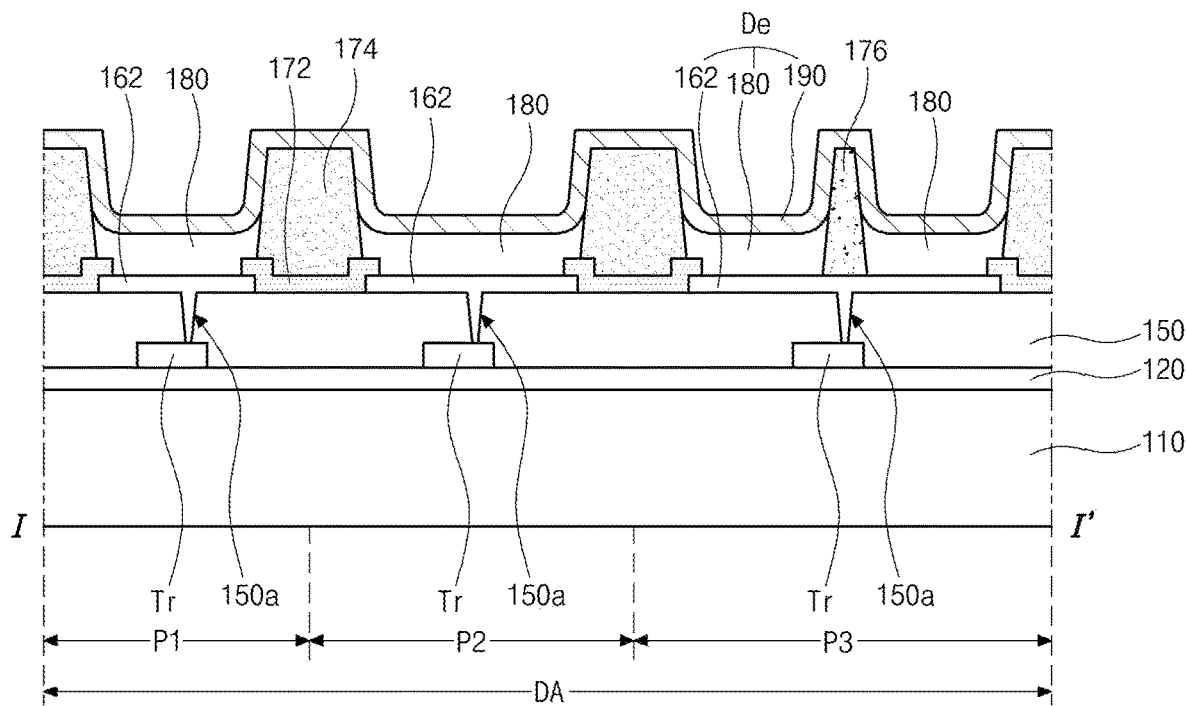
FIG. 4 is a cross-sectional view corresponding to the line I-I' of FIG. 3.
Figure 5:
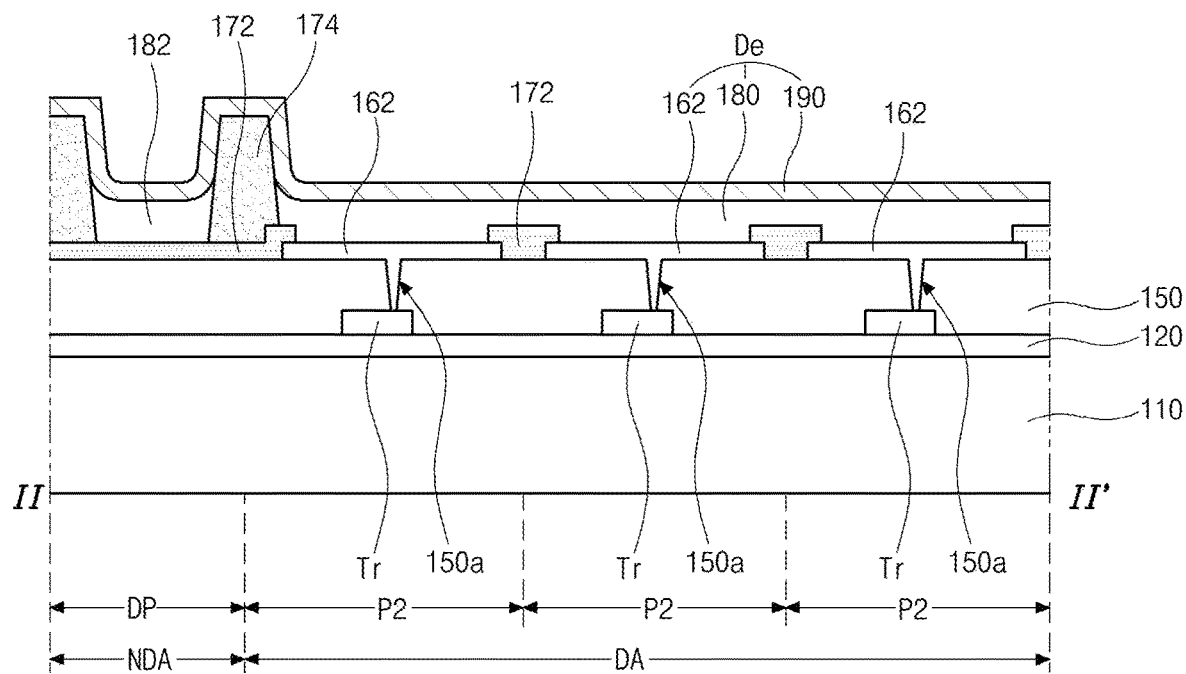
FIG. 5 is a cross-sectional view corresponding to the line II-II' of FIG. 3 according to the embodiment of the present disclosure.

FIG. 4 is a cross-sectional view corresponding to the line I-I' of FIG. 3, and FIG. 5 is a cross-sectional view corresponding to the line II-II' of FIG. 3.

As shown in FIG. 4 and FIG. 5, a display area DA and a non-display area NDA are defined on a substrate 110. First, second and third sub-pixels P1, P2 and P3 are defined in the display area DA, and at least one dummy sub-pixel DP is defined in the non-display area NDA adjacent to the second sub-pixel P2.

A buffer layer 120 is formed substantially on an entire surface of the substrate 110, and the buffer layer 120 is disposed in both the display area DA and the non-display area NDA.

A thin film transistors Tr is formed on the buffer layer 120 in each sub-pixel P1, P2 and P3. An overcoat layer 150 is formed on the thin film transistor Tr substantially over the entire surface of the substrate 110, and the overcoat layer 150 is disposed in both the display area DA and the non-display area NDA. Next, a first electrode 162 is formed on the overcoat layer 150 in each sub-pixel P1, P2 and P3.

Here, the thin film transistor Tr can have the configuration shown in FIG. 2, but is not limited thereto. In addition, although not shown in the figure, a gate insulation layer and an interlayer insulation layer can be further formed between the buffer layer 120 and the overcoat layer 150, and an inorganic insulation layer can be further formed between the thin film transistor Tr and the overcoat layer 150.

In each sub-pixel P1, P2 and P3 of the display area DA, the overcoat layer 150 has a drain contact hole 150a exposing a part of the thin film transistor Tr, that is, a drain electrode. The first electrode 162 of each sub-pixel P1, P2 and P3 contacts the drain electrode of the thin film transistor Tr through the drain contact hole 150a.

On the other hand, in the dummy sub-pixel DP of the non-display area NDA, a dummy thin film transistor (not shown) having the same configuration as the thin film transistor Tr of each sub-pixel P1, P2 and P3 can be formed between the buffer layer 120 and the overcoat layer 150 to make the level difference with the display area DA uniform, and a dummy electrode (not shown) can be formed on the overcoat layer 150 through the same process and of the same material as the first electrode 162. Here, the overcoat layer 150 does not have a drain contact hole exposing the dummy thin film transistor, and thus the dummy electrode is not connected to the dummy thin film transistor.

However, the configuration of the dummy sub-pixel DP is not limited thereto. For example, at least one of the dummy thin film transistor and the dummy electrode can be omitted.

A first bank 172 of a hydrophilic property is formed on the first electrode 162. The first bank 172 overlaps and covers edges of the first electrode 162. In the display area DA, the first bank 172 is formed between adjacent same color sub-pixels P1, P2 and P3 and between adjacent different color sub-pixels P1, P2 and P3. Alternatively, the first bank 172 can be omitted between adjacent different color sub-pixels P1, P2 and P3 and can be disposed only between adjacent same color sub-pixels P1, P2 and P3.

In addition, the first bank 172 is also formed in the non-display area NDA. At this time, the first bank 172 can be formed substantially all over the non-display area NDA. Alternatively, the first bank 172 can be removed in the non-display area NDA.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

A second bank 174 of a hydrophobic property is formed on the first bank 172. At least a top surface of the second bank 174 can have the hydrophobic property.

The second bank 174 is thicker than the first bank 172. The second bank 174 is formed only between adjacent different color sub-pixels P1, P2 and P3 and is not formed between adjacent same color sub-pixels P1, P2 and P3. A width of the second bank 174 is narrower than a width of the first bank 172 between adjacent different color sub-pixels P1, P2 and P3.

In the display area DA, the second bank 174 has an opening corresponding to each same color sub-pixel row and exposes the first electrodes 162 of the same color sub-pixel row and the first bank 172 between adjacent first electrodes 162 through the opening.

The second bank 174 is also formed in the non-display area NDA. The second bank 174 has an opening corresponding to the dummy sub-pixel DP in the non-display area NDA and exposes the first bank 172 through the opening of the non-display area NDA.

The second bank 174 can be formed of an organic insulating material having a hydrophobic property. Alternatively, the second bank 174 can be formed of an organic insulating material having a hydrophilic property and can be subjected to a hydrophobic treatment.

Meanwhile, a partition wall 176 is formed on the first electrode 162 of the third sub-pixel P3. The third sub-pixel P3 is divided into two regions by the partition wall 176. The partition wall 176 can overlap the drain contact hole 150a. Alternatively, the partition wall 176 can be spaced apart from the drain contact hole 150a.

The partition wall 176 can be formed through the same process and formed of the same material as the second bank 174. Accordingly, at least a top surface of the partition wall 176 can be hydrophobic.

In addition, a height of the partition wall 176 can be the same as a height of the second bank 174. Alternatively, the height of the partition wall 176 can be smaller than the height of the second bank 174. The second bank 174 should have a predetermined height in order to reduce color mixture between light-emitting layers of adjacent different sub-pixels P1, P2 and P3. However, since same color light-emitting layers are formed at both sides of the partition wall 176, there is no color mixture problem even if the partition wall 176 has a lower height that the second bank 174.

The first bank 172 of the hydrophilic property and the second bank 174 of the hydrophobic property can be formed of the same material and formed as one body. At this time, the first bank 172 and the second bank 174 can be formed through a half-tone mask process. In addition, the partition wall 176 can also be formed through the same process and formed of the same material as the first and second banks 172 and 174.

A light-emitting layer 180 is formed on the first electrode 162 of each sub-pixel P1, P2 and P3 in the display area DA. Here, a red light-emitting layer can be formed in the first sub-pixel P1, a green light-emitting layer can be formed in the second sub-pixel P2, and a blue light-emitting layer can be formed in the third sub-pixel P3.

A height of the light-emitting layer 180 of each sub-pixel P1, P2 and P3 rises as it gets closer to the second bank 174. At this time, the light-emitting layer 180 of the third sub-pixel P3 is divided by the partition wall 176. The height of the light-emitting layer 180 of the third sub-pixel P3 divided by the partition wall 176 rises as it gets closer to partition wall 176.

In addition, the light-emitting layer 180 is also formed on the first bank 172 between adjacent same color sub-pixels P1, P2 and P3. At this time, the light-emitting layer 180 on the first bank 172 between the adjacent same color sub-pixels P1, P2 and P3 is connected to the light-emitting layer 180 on the first electrode 162 in the sub-pixel P1, P2 and P3 adjacent thereto to thereby form one body. Accordingly, the light-emitting layers 180 of the adjacent same color sub-pixels P1, P2 and P3 are connected to each other to thereby form one body.

The light-emitting layer 180 includes a light-emitting material layer and is formed through a solution process. Here, the solutions dropped in respective sub-pixels P1, P2 and P3 through different nozzles corresponding to the same color sub-pixel row are connected to each other and dried to thereby form the light-emitting layers 180. Accordingly, the deviation in the dropping amount between nozzles can be minimized, and the thicknesses of the light-emitting layers of the sub-pixels P1, P2 and P3 can be uniformly formed.

Meanwhile, a dummy light-emitting layer 182 is formed on the first bank 172 of the dummy sub-pixel DP in the non-display area NDA. The dummy light-emitting layer 182 is formed through the same process and formed of the same material as the light-emitting layer 180.

That is, by dropping the solution using an injection apparatus including the nozzles, a solution layer is formed on the first electrode 162 of each sub-pixel P1, P2 and P3 of the display area DA, and a dummy solution layer is formed on the first bank 172 of the dummy sub-pixel DP of the non-display area NDA. Then, the solution layer and the dummy solution layer are dried, thereby forming the light-emitting layer 180 and the dummy light-emitting layer 182.

At this time, the dummy solution layer formed in the dummy sub-pixel DP corresponding to the second sub-pixel row increases the saturation of the solution at the ends of the second sub-pixel row, so that the solution layer corresponding to the second sub-pixel row can be prevented from being concentrated into the center of the display area DA. Accordingly, it is possible to reduce the problem that the light-emitting layer 180 is not formed in the sub-pixels P2 that are disposed at the ends of the second sub-pixel row.

In addition, by forming the partition wall 176 in the third sub-pixel P3 having the widest width, the third sub-pixel P3 is divided into two regions with the decreased width. The divided regions of the third sub-pixel P3 each have a relatively narrow width, so that the solution layer corresponding to the third sub-pixel row can be prevented from being concentrated into the center of the display area DA. Accordingly, it is possible to reduce the problem that the light-emitting layer 180 is not formed in the sub-pixels P3 that are disposed at the ends of the third sub-pixel row.

Next, a second electrode 190 is formed on the light-emitting layer 180, the dummy light-emitting layer 182 and the second bank 174. The second electrode 190 is disposed in both the display area DA and the non-display area NDA. Here, the second electrode 190 is also formed on a top surface and a side surface of the second bank 174 and is in contact with the top surface and the side surface of the second bank 174.

In addition, the second electrode 190 is formed on a top surface and a side surface of the partition wall 176 formed in the third sub-pixel P3, so that the second electrode 190 can be in contact with the top surface and the side surface of the partition wall 176.

The first electrode 162, the light-emitting layer 180 and the second electrode 190 constitute a light-emitting diode De.

As described above, in the electroluminescent display device 100 according to the first embodiment of the present disclosure, the light-emitting layers 180 of the same color sub-pixels P1, P2 and P3 are connected to each other and formed as one body, thereby minimizing the deviation in the dropping amounts between the nozzles and uniformly forming the thicknesses of the light-emitting layers 180 of the sub-pixels P1, P2 and P3. Therefore, the mura effect can be reduce, thereby reducing deterioration of the image quality of the display device.

At this time, the dummy sub-pixel DP including the dummy light-emitting layer 182 is provided in the non-display area NDA corresponding to the second sub-pixel row, which has a relatively wide width, and the saturation of the solution increases at the ends of the second sub-pixel row, so that the solution dropped in the second sub-pixel row can be prevented from being concentrated into the center of the display area DA.

In addition, the partition wall 176 is formed in the third sub-pixel P3 having the widest width, and the third sub-pixel P is divided into two regions with the decreased width, so that the solution dropped in the third sub-pixel row can be prevented from being concentrated into the center of the display area DA.

Accordingly, it is possible to reduce the problem that the light-emitting layer 180 is not formed in the sub-pixels P1, P2 and P3 that are disposed at the ends of the respective sub-pixel rows.

Figure 6A:
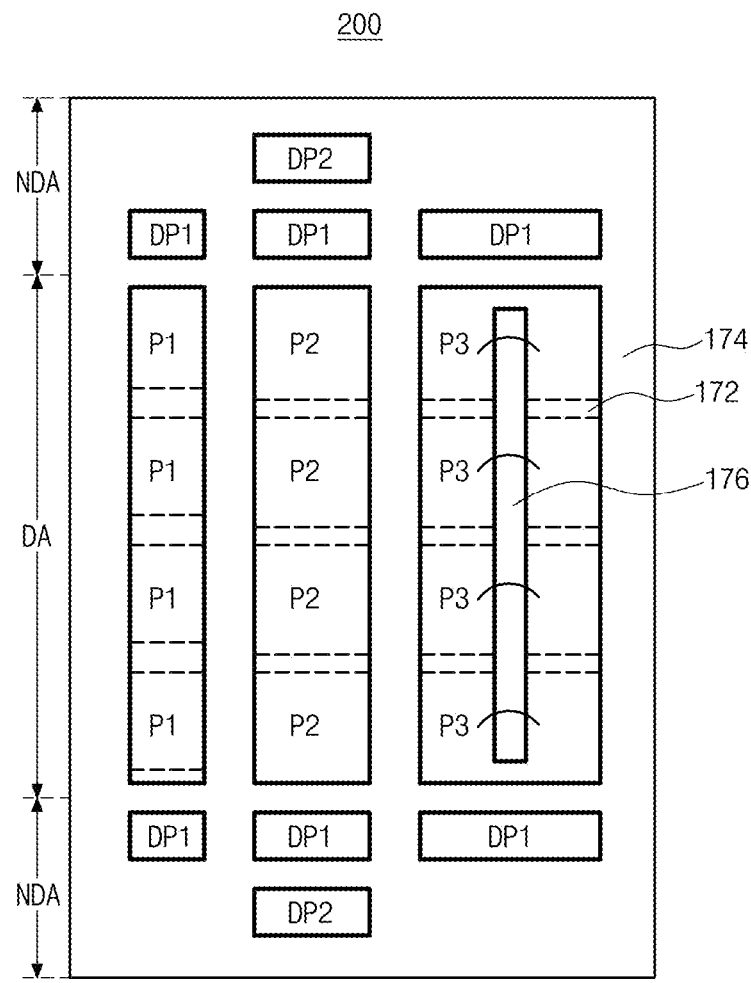
FIGS. 6A and 6B are schematic plan views of an electroluminescent display device according to a second embodiment of the present disclosure.
Figure 6B:
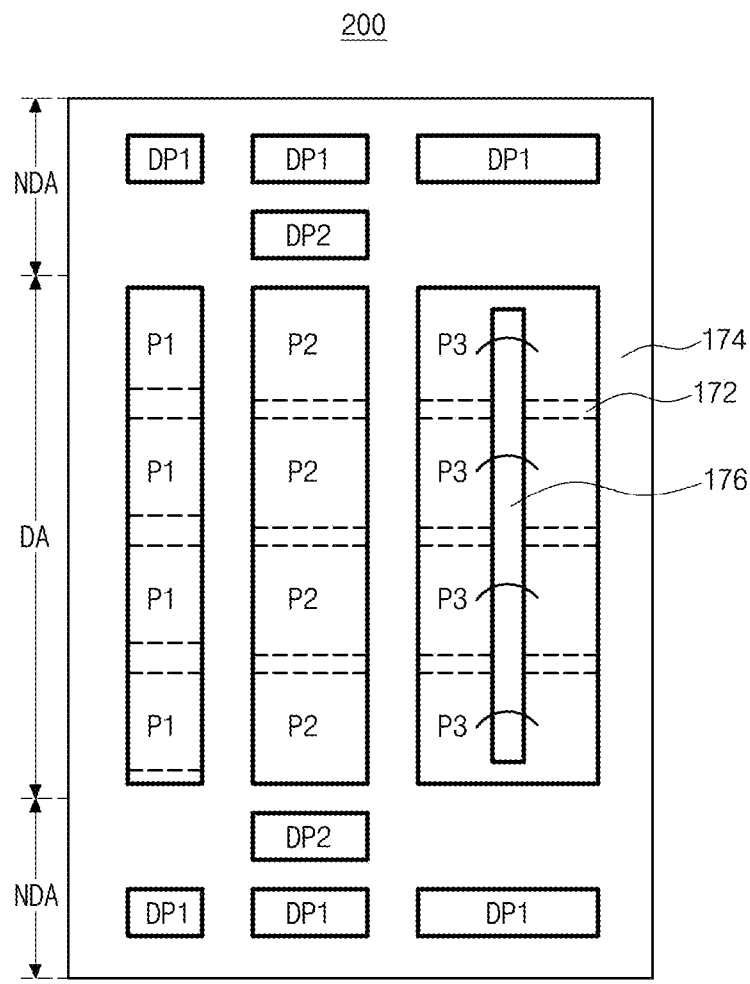

FIGS. 6A and 6B are schematic plan views of an electroluminescent display device according to a second embodiment of the present disclosure and mainly show a bank configuration. The electroluminescent display device of the second embodiment has substantially the same configuration as the first embodiment except for the number of dummy sub-pixels. The same parts as those of the first embodiment are designated by the same reference signs, and explanation for the same parts will be shortened or omitted.

In FIGS. 6A and 6B, the electroluminescent display device 200 according to the second embodiment of the present disclosure includes one dummy sub-pixel DP1 corresponding to the first and third sub-pixel rows and two dummy sub-pixels DP1 and DP2 corresponding to the second sub-pixel row in each of upper and lower portions of the non-display area NDA.

That is, a first dummy sub-pixel DP1 is provided to correspond to each of both sides of the first, second and third sub-pixel rows along the first direction, and a second dummy sub-pixel DP2 is provided to correspond to each of the both sides of the second sub-pixel row along the first direction. Here, the first dummy sub-pixels DP1 respectively corresponding to the first, second and third sub-pixel row can be disposed on the same line along the second direction. Widths of the first and second dummy sub-pixels DP1 and DP2 can be the same as the widths of the corresponding sub-pixel rows, respectively.

Accordingly, a total size of the dummy sub-pixels DP1 and DP2 corresponding to the second sub-pixel row is larger than a total size of the dummy sub-pixel DP1 corresponding to each of the first and third sub-pixel rows. In addition, the total size of the dummy sub-pixel DP1 corresponding to the third sub-pixel row is larger than the total size of the dummy sub-pixel DP1 corresponding to the first sub-pixel row.

As shown in FIG. 6A, the first dummy sub-pixel DP1 can be disposed between the second dummy sub-pixel DP2 and the display area DA.

Alternatively, as shown in FIG. 6B, the second dummy sub-pixel DP2 can be disposed between the first dummy sub-pixel DP1 and the display area DA.

The first and second dummy sub-pixels DP1 and DP2 increase the saturation of the solution at the ends of the respective sub-pixel rows, so that the solution is prevented from being concentrated into the center of the display area DA.

In addition, the partition wall 176 extending in the first direction is formed in the third sub-pixel P3 having the widest width, and the third sub-pixel P is divided into two regions with the decreased width. Accordingly, the divided regions of the third sub-pixel P have the relatively narrow width, so that the solution dropped in the third sub-pixel row is prevented from being concentrated into the center of the display area DA.

As described above, in the electroluminescent display device 200 according to the second embodiment of the present disclosure, the partition wall 176 is formed in the third sub-pixel row. Further, the number of the dummy sub-pixels DP1 and DP2 corresponding to the second sub-pixel row is different from the number of the dummy sub-pixels DP1 corresponding to each of the first and third sub-pixel rows, so that the total size of the dummy sub-pixels DP1 and DP2 corresponding to the second sub-pixel row is larger than the total size of the dummy sub-pixel DP1 corresponding to each of the first and third sub-pixel rows. Accordingly, it can be uniformly prevented for the sub-pixel rows having the different widths that the solutions are concentrated into the center of the display area DA.

Figure 7A:
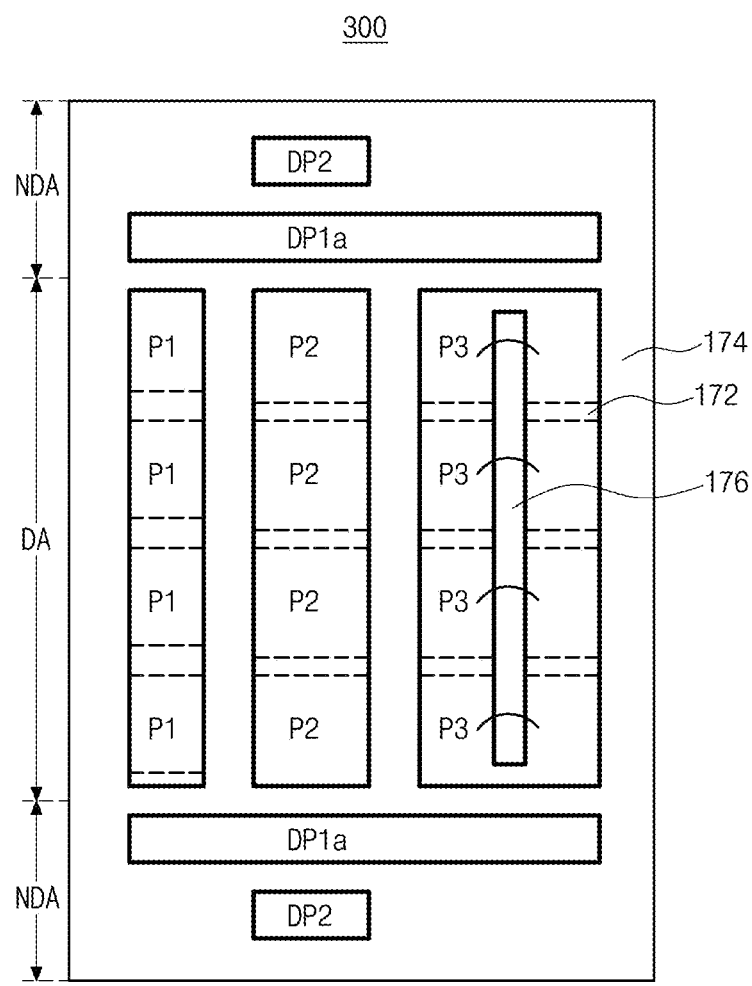
FIGS. 7A and 7B are schematic plan views of an electroluminescent display device according to a third embodiment of the present disclosure.
Figure 7B:
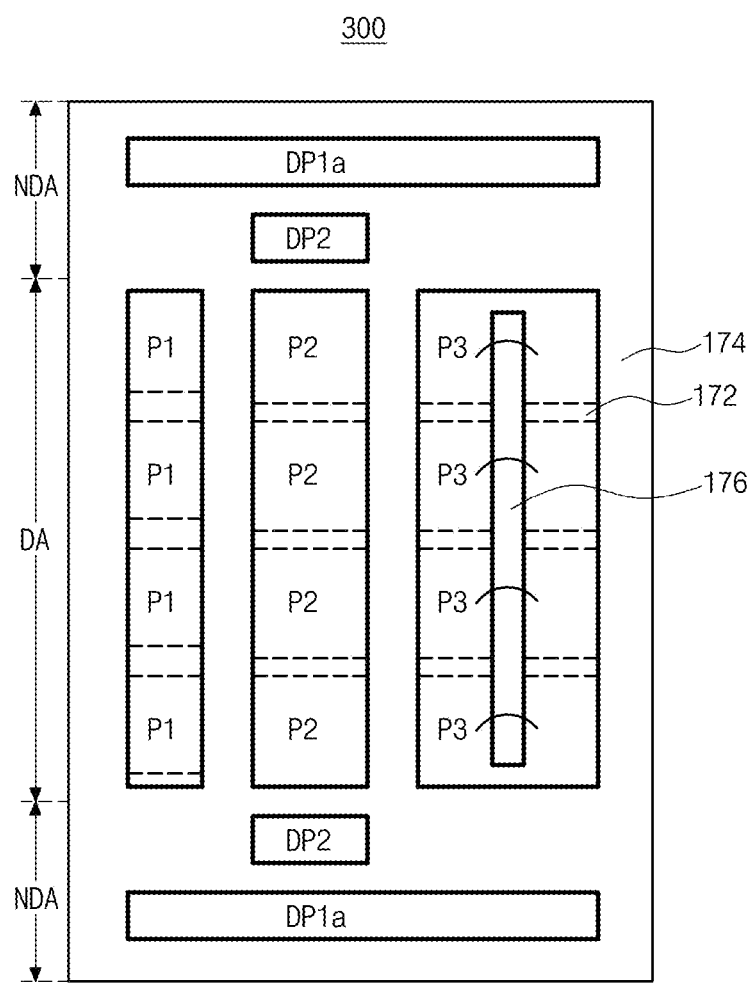

FIGS. 7A and 7B are schematic plan views of an electroluminescent display device according to a third embodiment of the present disclosure and mainly show a bank configuration. The electroluminescent display device of the third embodiment has substantially the same configuration as the first and second embodiments except for a first dummy sub-pixel. The same parts as those of the first and second embodiments are designated by the same reference signs, and explanation for the same parts will be shortened or omitted.

In FIGS. 7A and 7B, the electroluminescent display device 300 according to the third embodiment of the present disclosure includes a first dummy sub-pixel DP1a and a second dummy sub-pixel DP2 in each of upper and lower portions of the non-display area NDA.

At this time, the first dummy sub-pixel DP1a can be formed as one body in which the first dummy sub-pixels DP1 corresponding to the first, second and third sub-pixel rows in the second embodiment of FIGS. 6A and 6B are connected to each other. The first dummy sub-pixel DP1a extends in the second direction.

In addition, the second dummy sub-pixel DP2 is provided to correspond to the second sub-pixel row.

As shown in FIG. 7A, the first dummy sub-pixel DP1a can be disposed between the second dummy sub-pixel DP2 and the display area DA.

Alternatively, as shown in FIG. 7B, the second dummy sub-pixel DP2 can be disposed between the first dummy sub-pixel DP1a and the display area DA.

The first and second dummy sub-pixels DP1a and DP2 increase the saturation of the solution at the ends of the respective sub-pixel rows, so that the solution is prevented from being concentrated into the center of the display area DA.

In addition, the partition wall 176 extending in the first direction is formed in the third sub-pixel P3 having the widest width, and the third sub-pixel P is divided into two regions with the decreased width. Accordingly, the divided regions of the third sub-pixel P have the relatively narrow width, so that the solution dropped in the third sub-pixel row is prevented from being concentrated into the center of the display area DA.

As described above, in the electroluminescent display device 300 according to the third embodiment of the present disclosure, the partition wall 176 is formed in the third sub-pixel row. Further, the total size of the dummy sub-pixels DP1a and DP2 corresponding to the second sub-pixel row is larger than the total size of the dummy sub-pixel DP1a corresponding to each of the first and third sub-pixel rows. Accordingly, it can be uniformly prevented for the sub-pixel rows having the different widths that the solutions are concentrated into the center of the display area DA.

Figure 8A:
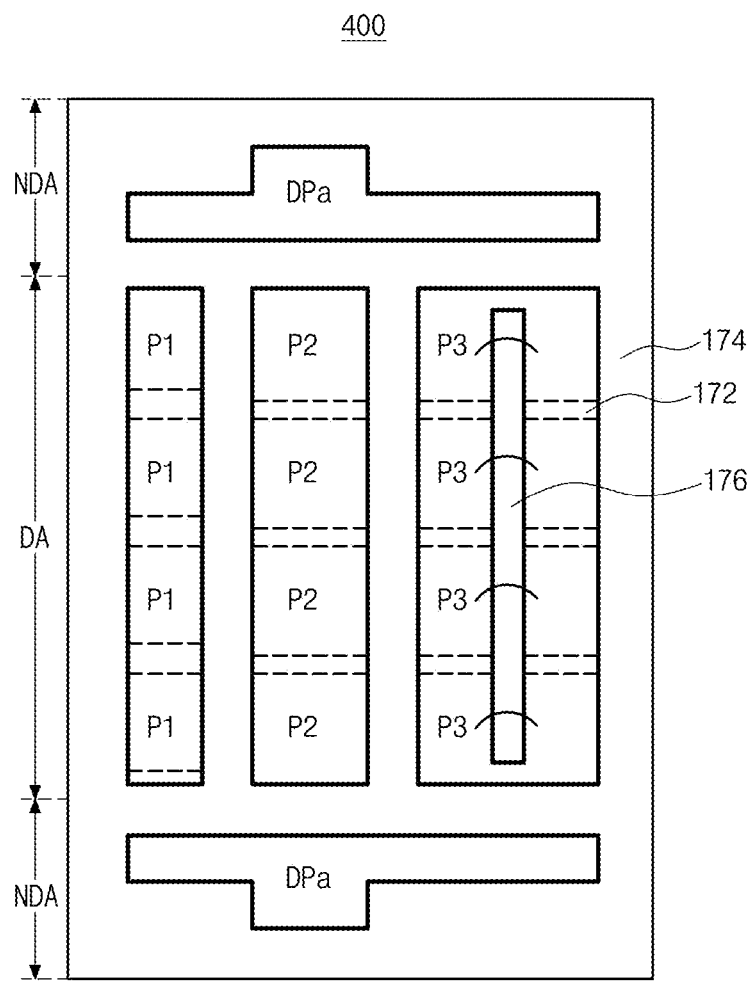
FIGS. 8A and 8B are schematic plan views of an electroluminescent display device according to a fourth embodiment of the present disclosure.
Figure 8B:
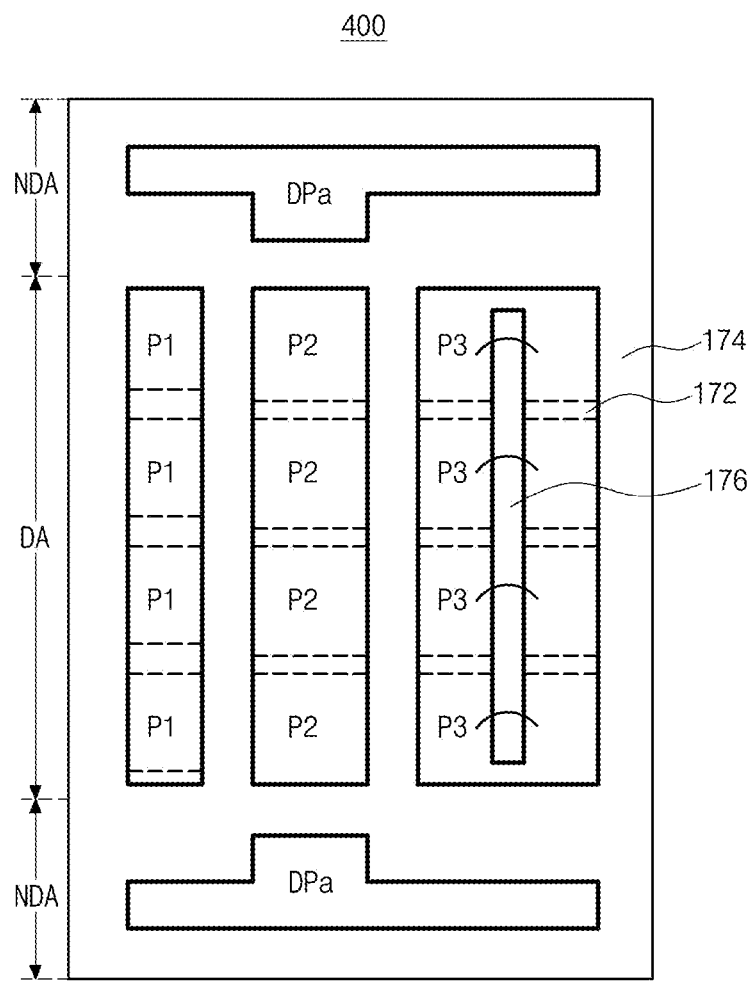

FIGS. 8A and 8B are schematic plan views of an electroluminescent display device according to a fourth embodiment of the present disclosure and mainly show a bank configuration. The electroluminescent display device of the fourth embodiment has substantially the same configuration as the first, second and third embodiments except for a dummy sub-pixel. The same parts as those of the first, second and third embodiments are designated by the same reference signs, and explanation for the same parts will be shortened or omitted.

In FIGS. 8A and 8B, the electroluminescent display device 400 according to the fourth embodiment of the present disclosure includes a dummy sub-pixel DPa in each of upper and lower portions of the non-display area NDA.

At this time, the dummy sub-pixel DPa can be formed as one body in which the first dummy sub-pixels DP1 corresponding to the first, second and third sub-pixel rows and the second dummy sub-pixel DP2 corresponding to the second sub-pixel row in the second embodiment of FIGS. 6A and 6B are connected to each other.

Accordingly, the width of the dummy sub-pixel DPa corresponding to the second sub-pixel row is wider than the width of the dummy sub-pixel DPa corresponding to each of the first and third sub-pixel rows along the first direction. The dummy sub-pixel DPa can have a protrusion corresponding to the second sub-pixel row.

As shown in FIG. 8A, the protrusion of the dummy sub-pixel DPa can be disposed to face a direction opposite to the display area DA.

Alternatively, as shown in FIG. 8B, the protrusion of the dummy sub-pixel DPa can be disposed to face the display area DA.

The dummy sub-pixels DPa increases the saturation of the solution at the ends of the respective sub-pixel rows, so that the solution is prevented from being concentrated into the center of the display area DA.

In addition, the partition wall 176 extending in the first direction is formed in the third sub-pixel P3 having the widest width, and the third sub-pixel P is divided into two regions with the decreased width. Accordingly, the divided regions of the third sub-pixel P have the relatively narrow width, so that the solution dropped in the third sub-pixel row is prevented from being concentrated into the center of the display area DA.

As described above, in the electroluminescent display device 400 according to the fourth embodiment of the present disclosure, the partition wall 176 is formed in the third sub-pixel row. Further, the total size of the dummy sub-pixel DPa corresponding to the second sub-pixel row is larger than the total size of the dummy sub-pixel DPa corresponding to each of the first and third sub-pixel rows. Accordingly, it can be uniformly prevented for the sub-pixel rows having the different widths that the solutions are concentrated into the center of the display area DA.

Figure 9A:
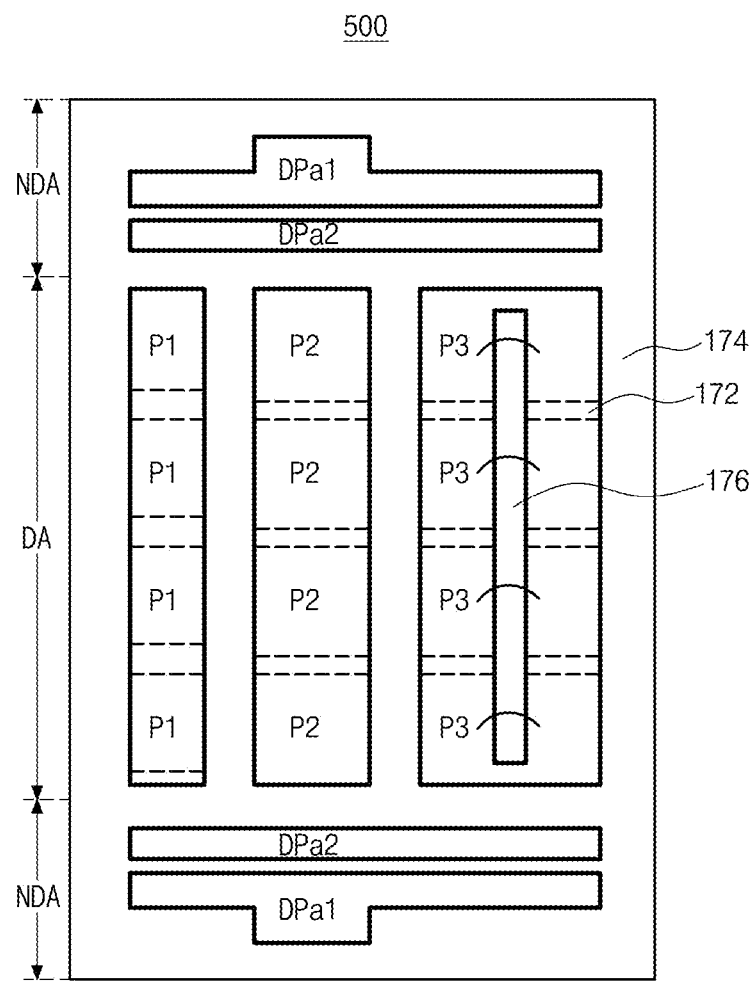
FIGS. 9A and 9B are schematic plan views of an electroluminescent display device according to a fifth embodiment of the present disclosure.
Figure 9B:
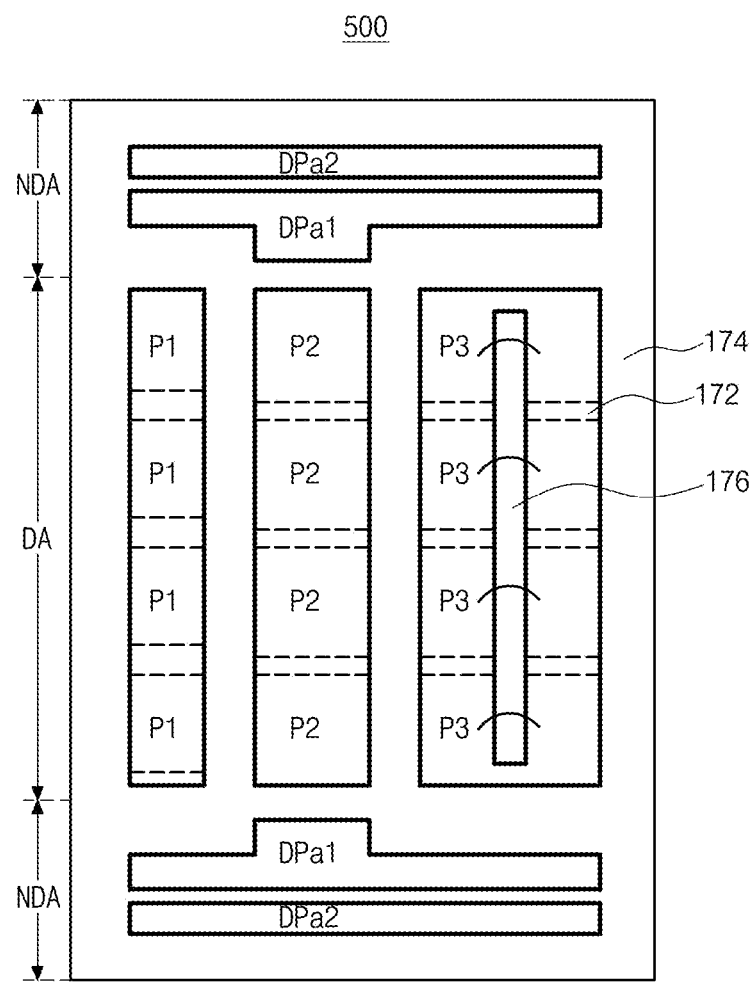

FIGS. 9A and 9B are schematic plan views of an electroluminescent display device according to a fifth embodiment of the present disclosure and mainly show a bank configuration. The electroluminescent display device of the fifth embodiment has substantially the same configuration as the first, second, third and fourth embodiments except for a dummy sub-pixel. The same parts as those of the first, second, third and fourth embodiments are designated by the same reference signs, and explanation for the same parts will be shortened or omitted.

In FIGS. 9A and 9B, the electroluminescent display device 500 according to the fifth embodiment of the present disclosure includes a dummy sub-pixel DPa1 and DPa2 in each of upper and lower portions of the non-display area NDA.

At this time, the dummy sub-pixel DPa1 and DPa2 includes a first portion DPa1 and a second portion DPa2, which can be formed by dividing the dummy sub-pixel DPa of the fourth embodiment of FIGS. 8A and 8B into two portions along the first direction. Therefore, the first and second portions DPa1 and DPa2 each have a narrower width than the dummy sub-pixel DPa of the fourth embodiment of FIGS. 8A and 8B. The first and second portions DPa1 and DPa2 can prevent the solution from being concentrated into the center from both ends of the dummy sub-pixel DPa1 and DPa2 extending along the second direction.

At this time, the width of the dummy sub-pixel DPa1 and DPa2 corresponding to the second sub-pixel row is wider than the width of the dummy sub-pixel DPa1 and DPa2 corresponding to each of the first and third sub-pixel rows along the first direction.

The first portion DPa1 of the dummy sub-pixel DPa1 and DPa2 can have a protrusion corresponding to the second sub-pixel row.

As shown in FIG. 9A, the protrusion of the first portion DPa1 can be disposed to face a direction opposite to the display area DA. In this case, the second portion DPa2 can be disposed between the first portion DPa1 and the display area DA.

Alternatively, as shown in FIG. 9B, the protrusion of the first portion DPa1 can be disposed to face the display area DA. In this case, the first portion DPa1 can be disposed between the second portion DPa2 and the display area DA.

The dummy sub-pixel DPa1 and DPa2 increases the saturation of the solution at the ends of the respective sub-pixel rows, so that the solution is prevented from being concentrated into the center of the display area DA.

In addition, the partition wall 176 extending in the first direction is formed in the third sub-pixel P3 having the widest width, and the third sub-pixel P is divided into two regions with the decreased width. Accordingly, the divided regions of the third sub-pixel P have the relatively narrow width, so that the solution dropped in the third sub-pixel row is prevented from being concentrated into the center of the display area DA.

As described above, in the electroluminescent display device 500 according to the fifth embodiment of the present disclosure, the partition wall 176 is formed in the third sub-pixel row. Further, the total size of the dummy sub-pixel DPa1 and DPa2 corresponding to the second sub-pixel row is larger than the total size of the dummy sub-pixel DPa1 and DPa2 corresponding to each of the first and third sub-pixel rows. Accordingly, it can be uniformly prevented for the sub-pixel rows having the different widths that the solutions are concentrated into the center of the display area DA.

Figure 10:
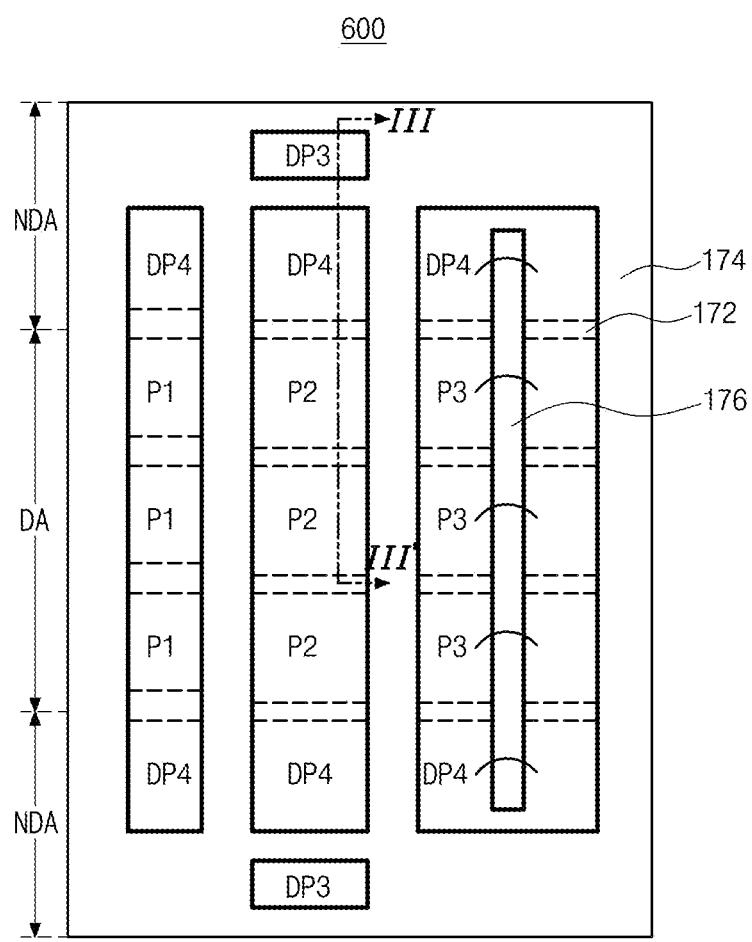
FIG. 10 is a schematic plan view of an electroluminescent display device according to a sixth embodiment of the present disclosure.

FIG. 10 is a schematic plan view of an electroluminescent display device according to a sixth embodiment of the present disclosure and mainly shows a bank configuration. The electroluminescent display device of the sixth embodiment has substantially the same configuration as the first embodiment except for dummy sub-pixels. The same parts as those of the first embodiment are designated by the same reference signs, and explanation for the same parts will be shortened or omitted.

In FIG. 10, the electroluminescent display device 600 according to the sixth embodiment of the present disclosure includes first dummy sub-pixels DP3 corresponding to the second sub-pixel row and second dummy sub-pixels DP4 corresponding to each of the first, second and third sub-pixel rows in the non-display area NDA. One first dummy sub-pixel DP3 is disposed at each of both sides of the second sub-pixel row along the first direction, and one second dummy sub-pixel DP4 is disposed at each of both ends of the first, second and third sub-pixel rows.

Here, the second dummy sub-pixel DP4 is disposed between the first dummy sub-pixel DP3 and the display area DA. The second dummy sub-pixel DP4 is connected to the sub-pixel P1, P2 and P3 of the corresponding sub-pixel row. That is, the opening of the second bank 174 corresponding to each sub-pixel row extends into the second dummy sub-pixel DP4, and the light-emitting layer of the second dummy sub-pixel DP4 is connected to the light-emitting layer of the corresponding sub-pixel row to thereby form one body.

At this time, the second dummy sub-pixel DP4 between the first dummy sub-pixel DP3 and the display area DA can be one or more. Namely, a plurality of second dummy sub-pixels DP4 can be disposed between the first dummy sub-pixel DP3 and the display area DA.

Meanwhile, the partition wall 176 extending in the first direction is formed in the third sub-pixel P3 having the widest width, and the third sub-pixel P is divided into two regions with the decreased width. Accordingly, the divided regions of the third sub-pixel P have the relatively narrow width, so that the solution dropped in the third sub-pixel row is prevented from being concentrated into the center of the display area DA.

Here, the partition wall 176 is also formed in the second dummy sub-pixel DP4 connected to the third sub-pixel row.

In the electroluminescent display device 600 according to the sixth embodiment of the present disclosure, the first dummy sub-pixel DP3 increases the saturation of the solution at ends of the second sub-pixel row, and the solution is prevented from being concentrated into the center of the display area DA.

In addition, the second dummy sub-pixels DP4 are further provided to be connected to respective sub-pixel rows. Even if the solution corresponding to each sub-pixel row is concentrated into the center of the display area DA, the problem that the light-emitting layer is not formed or is formed to a non-uniform thickness may occur only in the second dummy sub-pixel DP4, so that thicknesses of the light-emitting layers formed in the respective sub-pixels P1, P2 and P3 can be uniform.

A cross-sectional structure of the electroluminescent display device according to the sixth embodiment of the present disclosure will be described with reference to FIG. 11.

Figure 11:
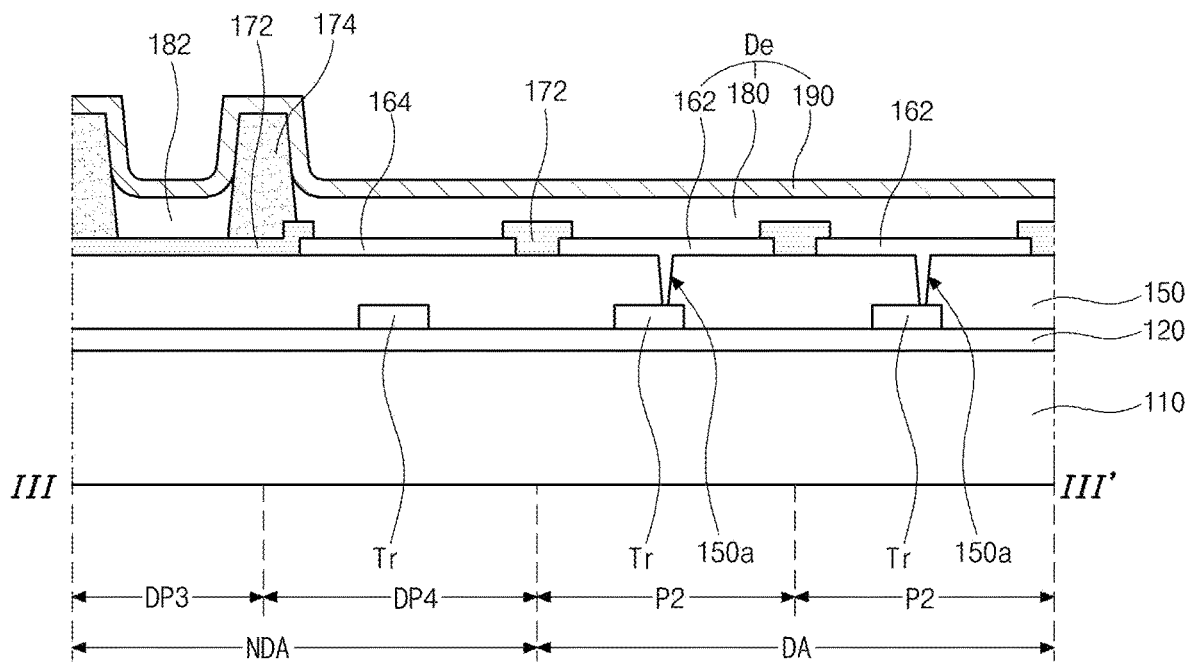
FIG. 11 is a cross-sectional view corresponding to the line III-III' of FIG. 10 according to the embodiment of the present disclosure.

FIG. 11 is a cross-sectional view corresponding to the line III-III' of FIG. 10 according to one embodiment.

As shown in FIG. 11, the display area DA and the non-display area NDA are defined on the substrate 110. A plurality of sub-pixels, for example, second sub-pixels P2 are defined in the display area DA, and the first and second dummy sub-pixels DP3 and DP4 are defined in the non-display area NDA.

Here, the second dummy sub-pixel DP4 is disposed between the first dummy sub-pixel DP3 and the display area DA.

The buffer layer 120 is formed substantially on the entire surface of the substrate 110, and the buffer layer 120 is disposed in both the display area DA and the non-display area NDA.

The thin film transistors Tr is formed on the buffer layer 120 in each of the sub-pixels P2 and the second dummy sub-pixel DP4. The overcoat layer 150 is formed on the thin film transistor Tr substantially over the entire surface of the substrate 110, and the overcoat layer 150 is disposed in both the display area DA and the non-display area NDA.

Here, the thin film transistor Tr can have the configuration shown in FIG. 2, but is not limited thereto. In addition, although not shown in the figure, the gate insulation layer and the interlayer insulation layer can be further formed between the buffer layer 120 and the overcoat layer 150, and an inorganic insulation layer can be further formed between the thin film transistor Tr and the overcoat layer 150.

Next, the first electrode 162 is formed on the overcoat layer 150 in each sub-pixel P2. In addition, a dummy electrode 164 is formed on the overcoat layer 150 in the second dummy sub-pixel DP4. The dummy electrode 164 can be formed through the same process and formed of the same material as the first electrode 162.

In each sub-pixel P2 of the display area DA, the overcoat layer 150 has the drain contact hole 150a exposing a part of the thin film transistor Tr, that is, the drain electrode. The first electrode 162 of each sub-pixel P2 contacts the drain electrode of the thin film transistor Tr through the drain contact hole 150a.

On the other hand, in the non-display area NDA, the overcoat layer 150 does not have a drain contact hole, and thus the dummy electrode 164 of the second dummy sub-pixel DP4 is not connected to the thin film transistor Tr.

Meanwhile, at least one of the thin film transistor Tr and the dummy electrode 164 can be omitted in the second dummy sub-pixel DP4.

In addition, in the first dummy sub-pixel DP3 of the non-display area NDA, a dummy thin film transistor (not shown) having the same configuration as the thin film transistor Tr of each sub-pixel P2 can be formed between the buffer layer 120 and the overcoat layer 150 to make the level difference with the display area DA uniform, and a dummy electrode (not shown) can be formed on the overcoat layer 150 through the same process and of the same material as the first electrode 162.

The first bank 172 of a hydrophilic property is formed on the first electrode 162. The first bank 172 overlaps and covers edges of the first electrode 162. In the display area DA, the first bank 172 is formed between adjacent same color sub-pixels P2 and between adjacent different color sub-pixels P1, P2 and P3 of FIG. 10. Alternatively, the first bank 172 can be omitted between adjacent different color sub-pixels P1, P2 and P3 of FIG. 10 and can be disposed only between adjacent same color sub-pixels P2.

The first bank 172 is also formed in the non-display area NDA. At this time, the first bank 172 is formed on the dummy electrode 164 of the second dummy sub-pixel DP4 and overlaps and covers the edges of the dummy electrode 164. In addition, the first bank 172 can also be formed in the first dummy sub-pixel DP3. Alternatively, the first bank 172 can be removed in the first dummy sub-pixel DP3.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 174 of a hydrophobic property is formed on the first bank 172. At least a top surface of the second bank 174 can have the hydrophobic property.

The second bank 174 has a thicker thickness than the first bank 172. The second bank 174 is formed only between adjacent different color sub-pixels P1, P2 and P3 of FIG. 10 and is not formed between adjacent same color sub-pixels P2.

In the display area DA, the second bank 174 has the opening corresponding to the same color sub-pixel row and exposes the first electrodes 162 of the same color sub-pixel row and the first bank 172 between adjacent first electrodes 162 through the opening.

The opening of the second bank 174 extends into the non-display area NDA. More particularly, the opening of the second bank 174 extends into the second dummy sub-pixel DP4 and exposes the dummy electrode 164 and the first bank 172 between the dummy electrode 164 and the first electrode 162.

In addition, the second bank 174 is also formed in the non-display area NDA. The second bank 174 has an opening corresponding to the first dummy sub-pixel DP3 in the non-display area NDA and exposes the first bank 172 through the opening of the non-display area NDA.

The second bank 174 can be formed of an organic insulating material having a hydrophobic property. Alternatively, the second bank 174 can be formed of an organic insulating material having a hydrophilic property and can be subjected to a hydrophobic treatment.

The first bank 172 of the hydrophilic property and the second bank 174 of the hydrophobic property can be formed of the same material and formed as one body.

The light-emitting layer 180 is formed on the first electrode 162 of each sub-pixel P2 in the display area DA. Here, the light-emitting layer 180 is also formed on the dummy electrode 164 of the second dummy sub-pixel DP4.

At this time, the light-emitting layers 180 of the adjacent same color sub-pixels P2 are connected to each other to thereby form one body. In addition, the light-emitting layer 180 of the second dummy sub-pixel DP4 is connected to the light-emitting layer 180 of the sub-pixel P2 adjacent thereto to thereby form one body.

The light-emitting layer 180 includes a light-emitting material layer and is formed through a solution process. Here, the solutions dropped in respective sub-pixels P2 corresponding to the same color sub-pixel row through different nozzles are connected to each other and dried to thereby form the light-emitting layers 180. Accordingly, the deviation in the dropping amount between nozzles can be minimized, and the thicknesses of the light-emitting layers of the sub-pixels P2 can be uniformly formed.

Meanwhile, the dummy light-emitting layer 182 is formed on the first bank 172 of the first dummy sub-pixel DP3 in the non-display area NDA. The dummy light-emitting layer 182 is formed through the same process and formed of the same material as the light-emitting layer 180.

Next, the second electrode 190 is formed on the light-emitting layer 180, the dummy light-emitting layer 182 and the second bank 174. The second electrode 190 is disposed in both the display area DA and the non-display area NDA. Here, the second electrode 190 is also formed on the top surface and the side surface of the second bank 174 and is in contact with the top surface and the side surface of the second bank 174.

The first electrode 162, the light-emitting layer 180 and the second electrode 190 constitute a light-emitting diode De.

As described above, in the electroluminescent display device according to the sixth embodiment of the present disclosure, the light-emitting layers 180 of the same color sub-pixels P2 are connected to each other and formed as one body, thereby reducing the deviation in the dropping amounts between the nozzles and uniformly forming the thicknesses of the light-emitting layers 180 of the sub-pixels P2. Therefore, the mura effect can be reduced, thereby reducing the deterioration of the image quality of the display device.

The first dummy sub-pixel DP3 increases the saturation of the solution at the ends of the corresponding sub-pixel row, so that the solution is prevented from being concentrated into the center of the display area DA.

In addition, the second dummy sub-pixel DP4 connected to the corresponding sub-pixel row is provided. Even if the solution corresponding to each sub-pixel row is concentrated into the center of the display area DA, the problem that the light-emitting layer is not formed or is formed to a non-uniform thickness may occur only in the second dummy sub-pixel DP4, so that thicknesses of the light-emitting layers formed in the respective sub-pixels P2 can be uniform.

In the present disclosure, by forming the light-emitting layer of each sub-pixel through the solution process, the fine metal mask can be omitted to thereby reduce the manufacturing costs, and a display device with a large size and high definition can be implemented.

In addition, the light-emitting layers of the same color sub-pixels are connected to each other and formed as one body, thereby minimizing the deviation in the dropping amount between nozzles and uniformly forming the thicknesses of the light-emitting layers of the sub-pixels. Therefore, the mura effect is reduced, thereby reducing the deterioration of the image quality of the display device.

Moreover, the dummy sub-pixel including the dummy light-emitting layer is provided in the non-display area corresponding to the sub-pixel row having the relatively wide width. When the light-emitting layers are formed, the saturation of the solution increases at the ends of the corresponding sub-pixel row, so that the solution is prevented from being concentrated into the center of the display area. Accordingly, it is possible to prevent the problem that the light-emitting layer is not formed at the edges of the display area.

Further, the partition wall is formed in the sub-pixel row having the widest width to thereby divide the sub-pixels into two regions having the relatively narrow width, so that the solution is prevented from being concentrated into the center of the display area. Accordingly, it is possible to further prevent the problem that the light-emitting layer is not formed at the edges of the display area.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
   a substrate on which a display area displaying an image and a non-display area disposed outside of the display area are defined;
   first, second, and third sub-pixel rows in the display area on the substrate, the first, the second, and the third sub-pixel rows each including a plurality of sub-pixels arranged along a first direction and disposed along a second direction perpendicular to the first direction;
   a light-emitting diode disposed at each of the plurality of sub-pixels and including a first electrode, a light-emitting layer, and a second electrode;
   an insulation layer between the substrate and the first electrode;
   a dummy sub-pixel in the non-display area on the substrate, the dummy sub-pixel corresponding to the second sub-pixel row; and
   a partition wall across the third sub-pixel row along the first direction and disposed on first electrodes of the third sub-pixel row,
   wherein a width of the second sub-pixel row along the second direction is larger than a width of the first sub-pixel row and smaller than a width of the third sub-pixel row,
   wherein each sub-pixel of the third sub-pixel row is divided into first and second regions by the partition wall and has two emission areas corresponding to the first and second regions, respectively, and the first electrode is disposed in the first and second regions,
   wherein each sub-pixel of the first and second sub-pixel rows does not include a partition wall and has a single emission area, and
   wherein the partition wall is in contact with the first electrode and is spaced apart from the insulation layer between the substrate and the first electrode,
   wherein the partition wall in one sub-pixel of the third sub-pixel row is connected to the partition wall in another sub-pixel of the third sub-pixel row along the first direction.

2. The electroluminescent display device of claim 1, where a dummy sub-pixel is further provided in the non-display area corresponding to each of the first sub-pixel row and the third sub-pixel row,
   wherein a total size of the dummy sub-pixel corresponding to the second sub-pixel row is larger than a total size of the dummy sub-pixel corresponding to the first sub-pixel row or the third sub-pixel row.

3. The electroluminescent display device of claim 2, wherein a total number of the dummy sub-pixels corresponding to the second sub-pixel row is more than a total number of the dummy sub-pixels corresponding to the first sub-pixel row or the third sub-pixel row.

4. The electroluminescent display device of claim 2, wherein a total number of dummy sub-pixels corresponding to the second sub-pixel row are two, and a total number of dummy sub-pixels corresponding to the first sub-pixel row or the third sub-pixel row is one.

5. The electroluminescent display device of claim 1, wherein the dummy sub-pixel is a first dummy sub-pixel, and
   wherein the first dummy sub-pixel is further provided to correspond to each of the first sub-pixel row and the third sub-pixel row, and a second dummy sub-pixel is further provided to correspond to the second sub-pixel row in the non-display area.

6. The electroluminescent display device of claim 5, wherein first dummy sub-pixels are disposed between the second dummy sub-pixel and the display area.

7. The electroluminescent display device of claim 6, wherein the first dummy sub-pixels corresponding to the first sub-pixel row, the second sub-pixel row, and the third sub-pixel row are connected to each other.

8. The electroluminescent display device of claim 7, wherein the first dummy sub-pixels corresponding to the first sub-pixel row, the second sub-pixel row, and the third sub-pixel row are connected to the second dummy sub-pixel.

9. The electroluminescent display device of claim 5, wherein the second dummy sub-pixel is disposed between the first dummy sub-pixels and the display area.

10. The electroluminescent display device of claim 9, wherein the first dummy sub-pixels corresponding to the first sub-pixel row, the second sub-pixel row, and the third sub-pixel row are connected to each other.

11. The electroluminescent display device of claim 10, wherein the first dummy sub-pixels corresponding to the first sub-pixel row, the second sub-pixel row, and the third sub-pixel row are connected to the second dummy sub-pixel.

12. The electroluminescent display device of claim 1, wherein a dummy light-emitting layer of the dummy sub-pixel is spaced apart from light-emitting layers of the plurality of the sub-pixels of the second sub-pixel row.

13. The electroluminescent display device of claim 12, wherein the light-emitting layers of the plurality of the sub-pixels of each of the first sub-pixel row, the second sub-pixel row, and the third sub-pixel row are connected to each other and formed as one body.

14. The electroluminescent display device of claim 1, wherein the dummy sub-pixel is a first dummy sub-pixel,
    wherein a second dummy sub-pixel is further provided to correspond to each of the first sub-pixel row, the second sub-pixel row, and the third sub-pixel row in the non-display area, and
    wherein a light-emitting layer of the second dummy sub-pixel is connected to the light-emitting layer of the sub-pixel of a corresponding sub-pixel row to thereby form one body.

15. The electroluminescent display device of claim 1, further comprising a first bank disposed between adjacent sub-pixels along the first direction and a second bank disposed between adjacent two of the first sub-pixel row, the second sub-pixel row, and the third sub-pixel row along the second direction.

16. The electroluminescent display device of claim 15, wherein the first bank has a hydrophilic property and the second bank has a hydrophobic property.

17. The electroluminescent display device of claim 15, wherein the first bank and the second bank are formed as one body.

18. The electroluminescent display device of claim 15, wherein a width of the partition wall is equal to or less than a width of the second bank.

19. The electroluminescent display device of claim 15, wherein the partition wall is in contact with the second bank.

20. The electroluminescent display device of claim 1, further comprising at least one thin film transistor between the substrate and the first electrode, the first electrode connected to the at least one thin film transistor.

21. The electroluminescent display device of claim 1, wherein a top surface of the partition wall is hydrophobic.

22. The electroluminescent display device of claim 1, wherein the second electrode is in contact with top and side surfaces of the partition wall.

23. The electroluminescent display device of claim 15, wherein the partition wall has a same height as the second bank.

24. The electroluminescent display device of claim 1, wherein a first portion of the first electrode disposed in the first region is in contact with a second portion of the first electrode disposed in the second region.

* * * * *